(12) United States Patent
Clifton et al.

(10) Patent No.: US 8,576,548 B2
(45) Date of Patent: Nov. 5, 2013

(54) COMMUNICATIONS VEHICLE

(71) Applicants: Christopher Clifton, Bloomfield, IN (US); James M. Pruett, Montgomery, IN (US); David Myers, Bloomfield, IN (US); Philip S. Mitchell, Springville, IN (US); Dean Lee Jones, Bloomington, IN (US)

(72) Inventors: Christopher Clifton, Bloomfield, IN (US); James M. Pruett, Montgomery, IN (US); David Myers, Bloomfield, IN (US); Philip S. Mitchell, Springville, IN (US); Dean Lee Jones, Bloomington, IN (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 13/626,245

(22) Filed: Sep. 25, 2012

(65) Prior Publication Data
US 2013/0016491 A1    Jan. 17, 2013

Related U.S. Application Data

(62) Division of application No. 12/696,861, filed on Jan. 29, 2010.

(60) Provisional application No. 61/291,694, filed on Dec. 31, 2009.

(51) Int. Cl.
| H02B 1/056 | (2006.01) |
| H02B 1/00 | (2006.01) |
| H02B 5/00 | (2006.01) |
| H02B 7/00 | (2006.01) |
| H02B 11/00 | (2006.01) |
| H02B 13/02 | (2006.01) |

(52) U.S. Cl.
USPC ........... 361/633; 361/601; 361/605; 361/606; 361/614; 361/814

(58) Field of Classification Search
USPC ......... 361/814, 600, 601, 605, 606, 614, 616, 361/627, 633, 644, 730; 454/119
See application file for complete search history.

(56) References Cited

U.S. PATENT DOCUMENTS

| 3,858,091 A | 12/1974 | Wilkinson |
| 3,960,353 A | 6/1976 | Leutwyler |
| 4,460,895 A | 7/1984 | Bert et al. |
| 4,496,057 A | 1/1985 | Zenitani et al. |
| 4,497,411 A | 2/1985 | DeBortoli |
| 4,746,263 A | 5/1988 | Cook |
| 4,792,881 A | 12/1988 | Wilson et al. |

(Continued)

FOREIGN PATENT DOCUMENTS

GB    1 246 538    9/1971

OTHER PUBLICATIONS

Antenna Products PM Mast Series—"Telescopic Masts", retrieved from: http://www.antennaproducts.com/telmasts.pdf., pp. 42 and 43, Mineral Wells, TX.

(Continued)

*Primary Examiner* — Hoa C Nguyen
*Assistant Examiner* — Binh Tran
(74) *Attorney, Agent, or Firm* — Christopher A. Monsey

(57) ABSTRACT

A vehicle is provided that includes a shelter thereon that includes electronics therein. The shelter includes ports on the exterior thereof that permit data and power exchange between the vehicle and another similarly configured vehicle. The vehicle further includes dedicated wiring raceways that separate wiring having different uses.

35 Claims, 12 Drawing Sheets

(56) References Cited

U.S. PATENT DOCUMENTS

| | | | |
|---|---|---|---|
| 4,802,008 A | 1/1989 | Walling |
| 4,815,757 A | 3/1989 | Hamilton |
| 4,871,103 A | 10/1989 | Martinsson |
| 4,932,176 A | 6/1990 | Roberts et al. |
| 4,952,908 A | 8/1990 | Sanner |
| 5,025,253 A | 6/1991 | DiLullo et al. |
| 5,070,429 A | 12/1991 | Skirpan |
| 5,229,925 A | 7/1993 | Spencer et al. |
| 5,239,129 A | 8/1993 | Ehrenfels |
| 5,272,279 A | 12/1993 | Filshie |
| 5,328,260 A | 7/1994 | Beirise |
| 5,366,071 A | 11/1994 | Laszlo |
| 5,546,495 A * | 8/1996 | Bruckner et al. ............. 385/135 |
| 5,572,837 A | 11/1996 | Featherstone et al. |
| 5,615,855 A | 4/1997 | Marue et al. |
| 5,683,001 A | 11/1997 | Masuda et al. |
| 5,721,394 A | 2/1998 | Mulks |
| 5,743,635 A | 4/1998 | Hulse et al. |
| 5,778,612 A | 7/1998 | Kissinger et al. |
| 5,794,794 A | 8/1998 | Hull |
| 5,819,956 A | 10/1998 | Rinderer |
| 5,831,519 A | 11/1998 | Pedersen et al. |
| 5,921,402 A | 7/1999 | Magenheimer |
| 6,127,939 A | 10/2000 | Lesesky et al. |
| 6,152,048 A | 11/2000 | Vander Park |
| 6,201,687 B1 | 3/2001 | Murray |
| 6,222,443 B1 | 4/2001 | Beeson et al. |
| 6,253,502 B1 | 7/2001 | Layton |
| 6,260,310 B1 | 7/2001 | Price et al. |
| 6,347,963 B1 | 2/2002 | Falkenberg et al. |
| 6,378,959 B2 | 4/2002 | Lesesky et al. |
| 6,466,431 B1 | 10/2002 | Thomas |
| 6,497,442 B1 | 12/2002 | Wacker |
| 6,501,376 B2 | 12/2002 | Dieckmann et al. |
| 6,531,790 B2 * | 3/2003 | Panuce et al. .................. 307/64 |
| 6,546,677 B1 | 4/2003 | Featherstone |
| 6,746,323 B1 * | 6/2004 | Digby, Jr. ........................ 454/91 |
| 6,796,438 B2 | 9/2004 | Mendoza |
| 6,964,463 B1 | 11/2005 | Hindle et al. |
| 6,970,772 B2 | 11/2005 | Radtke et al. |
| 7,000,357 B1 | 2/2006 | Stearns et al. |
| 7,017,760 B2 | 3/2006 | Zuclich et al. |
| 7,045,706 B1 | 5/2006 | Lincoln, III et al. |
| 7,080,865 B2 | 7/2006 | Bergeron et al. |
| 7,114,786 B2 | 10/2006 | Bess et al. |
| 7,142,098 B2 | 11/2006 | Lang et al. |
| 7,265,292 B2 | 9/2007 | Greenfield |
| 7,286,046 B2 | 10/2007 | Kinsey et al. |
| 7,462,777 B2 | 12/2008 | Dinh |
| 7,535,346 B2 | 5/2009 | Kalous |
| 7,712,760 B2 | 5/2010 | Ohtomo |
| 7,798,263 B2 | 9/2010 | Tandy et al. |
| 7,825,782 B2 | 11/2010 | Hermann |
| 8,031,061 B2 | 10/2011 | Kalous |
| 8,135,358 B1 * | 3/2012 | Hesse et al. .................. 455/90.3 |
| 8,276,325 B2 | 10/2012 | Clifton et al. |
| 8,283,562 B2 | 10/2012 | Clifton et al. |
| 2003/0036346 A1 * | 2/2003 | Wilson et al. .................. 454/119 |
| 2006/0240781 A1 * | 10/2006 | Tabe ............................. 455/66.1 |
| 2007/0102180 A1 | 5/2007 | Brosig-Rodriguez et al. |
| 2008/0258931 A1 | 10/2008 | Christensen et al. |

OTHER PUBLICATIONS

ArmyProperty.com, "Quick Erect Antenna Mast System (QEAM)," retrieved from http://www.armyproperty.com/Equipment-Info/Qeam.htm on Nov. 2, 2009, 4 pgs.

Clark Masts Fast Erecting Mast Systems, "Mast Mounting," retrieved from http://www.clarkmasts.com/mast_mounting.php on Oct. 31, 2009, 1 pg.

Floatograph Technologies, "Commercial Telescoping Masts," © 2008, retrieved from http://www.telescopingmast.com on Nov. 2, 2009, 24 pgs.

Trival Antene d.o.o., "Telecopic Winch Driven Masts STV," retrieved from http://www.trival-antennas-masts.com, 4 pgs., Kamnik, Solvenia.

Wenzlau Engineering, "Will-Burt Quick Erecting Antenna Masts," retrieved from http://www.wenzlau.com/masts-qeam.htm on Oct. 31, 2009, 2 pgs., Pasadena, CA.

The Will-Burt Company, "Mast Installation Guide for External Mounting," at least as early as Nov. 2, 2009, p. 1, sheet 412 and p. 18.

* cited by examiner

COMMUNICATIONS VEHICLE

CROSS-REFERENCE TO RELATED APPLICATIONS

The present divisional application claims priority to U.S. Provisional Patent Application Ser. No. 61/291,694, filed Dec. 31, 2009, entitled "VEHICLE AND MAST MOUNTING ASSEMBLY THEREFOR," and U.S. patent application Ser. No. 12/696,861, filed Jan. 29, 2010, entitled "COMMUNICATIONS VEHICLE," the disclosures of which are expressly incorporated by reference herein.

STATEMENT REGARDING FEDERALLY SPONSORED RESEARCH OR DEVELOPMENT

The invention described herein was made in the performance of official duties by employees of the Department of the Navy and may be manufactured, used and licensed by or for the United States Government for any governmental purpose without payment of any royalties thereon.

BACKGROUND OF THE INVENTION

Oftentimes it is necessary in the commercial and military communications field to locate communications hubs and controllers in areas proximate significant events. In such situations, communications gear has been transported in cases and then assembled on site. When the communications equipment is desired at a different location, the gear is disassembled, closed up in the cases, moved to the new location, unpacked, and then reassembled.

SUMMARY OF THE INVENTION

In one embodiment, a communications assembly is provided including a shelter housing; a first cabling raceway disposed within the shelter housing, the first cabling raceway being exclusively dedicated for radio frequency transmitting cabling; a second cabling raceway disposed within the shelter housing, the second cabling raceway being exclusively dedicated for non-radio frequency data transmitting cabling; and a third cabling raceway disposed within the shelter housing, the third cabling raceway being exclusively dedicated for alternating current and direct current transmitting cabling.

In another embodiment, a method of assembling a communications assembly is provided, the method including obtaining a shelter housing having side walls, a front wall, a rear wall, a floor, and a top wall; coupling a first cabling raceway to the walls at a first height, the first cabling raceway extending generally parallel to the top wall; coupling a second cabling raceway to the walls at a second height, the second cabling raceway extending generally parallel to the top wall; coupling a third cabling raceway to the walls at a third height, the third cabling raceway extending generally parallel to the top wall; placing radio-frequency transmission cabling exclusively within the first cabling raceway; placing non-radio-frequency data transmission cabling exclusively within the second cabling raceway; and placing alternating current transmission cabling and direct current transmission cabling exclusively within the third raceway.

In still another embodiment, a communications vehicle is provided, including a vehicle frame; a shelter housing supported by the frame, the shelter housing defining an interior and an exterior; a first communication device located within the interior of the shelter housing; and a signal interface positioned on the shelter housing. The signal interface includes ports thereon in communication the first communication device. The first communication device includes software therein that permits the first communication device to control and operate a second communication device that is substantially similar to the first communication device, that is located in a shelter housing separate from the shelter housing containing the first communication device, and that is electrically coupled via a wire to the signal interface.

In another embodiment, a method of expanding a communications array is provided including the steps of providing a first shelter on a first vehicle frame, the first shelter including a first radio therein and a first signal interface accessible from the exterior of the first shelter, the first radio providing a plurality of communication channels; providing a second Shelter on a second vehicle frame, the second shelter including a second radio therein and a second signal interface accessible from the exterior of the second shelter, the second radio providing a plurality of communication channels; electrically coupling ports on the first signal interface to ports on the second signal interface; and controlling all provided communications channels with the first radio.

In another embodiment, a vehicle array is provided including a first vehicle including a power input interface and a power output interface; a second vehicle including a power input interface and a power output interface; a power generator having a power output interface; a first power cable linking the power output interface of the power generator to the power input interface of the first vehicle; and a second power cable linking the power output interface of the first vehicle to the power input interface of the second vehicle.

In another embodiment, a method of powering a vehicle array is provided including the steps of providing a first vehicle having a frame and a first shelter supported on the frame, the first shelter including a power input interface and a power output interface; providing a second vehicle having a frame and a second shelter supported on the frame, the second shelter including a power input interface and a power output interface; providing a power generator having a power output; coupling the power output of the power generator to the power input interface of the first vehicle such that the power generator provides power to electronics housed within the first shelter; coupling the power output interface of the first shelter to the power input interface of the second shelter to provide power to electronics housed within the second shelter.

In another embodiment, a method of transporting a communications array is provided. The method including the steps of providing a first vehicle having a frame and a first shelter supported on the frame at a first location, the first shelter including plurality of communications devices therein, the communications devices being coupled to each other and to a signal interface disposed on the first shelter, the signal interface providing a plurality of ports that are accessible on the exterior of the first shelter; providing a second vehicle having a frame and a second shelter supported on the frame at the first location, the second shelter including plurality of communications devices therein, the communications devices being coupled to each other and to a signal interface disposed on the second shelter, the signal interface providing a plurality of ports that are accessible on the exterior of the second shelter; providing interconnect cables that interface with the signal interfaces of the first and second shelters to provide data connections between the plurality of electronics in the first and second shelters; uncoupling the interconnect cables from the first and second shelters; driving the first and second vehicles to a second location; and coupling the interconnect cables to the signal interfaces of the first and second shelters to provide data connections between the plurality of electronics in the first and second shelters at the second location.

In another embodiment, a vehicle is provided including a frame, an engine supported by the frame, the engine operatively coupled to ground engaging members and capable of imparting motion to at least one of the ground engaging members; a shelter housing coupled to the frame and dependent upon the frame for supporting the shelter housing; a first communication device located within the interior of the shelter housing; and a signal interface positioned on the shelter housing, the signal interface including ports thereon in communication the first communication device; wherein the first communication device includes software therein that permits the first communication device to control and operate a second communication device that is substantially similar to the first communication device, that is located in a shelter housing separate from the shelter housing containing the first communication device, and that is electrically coupled via a wire to the signal interface.

DETAILED DESCRIPTION

Figure 1:
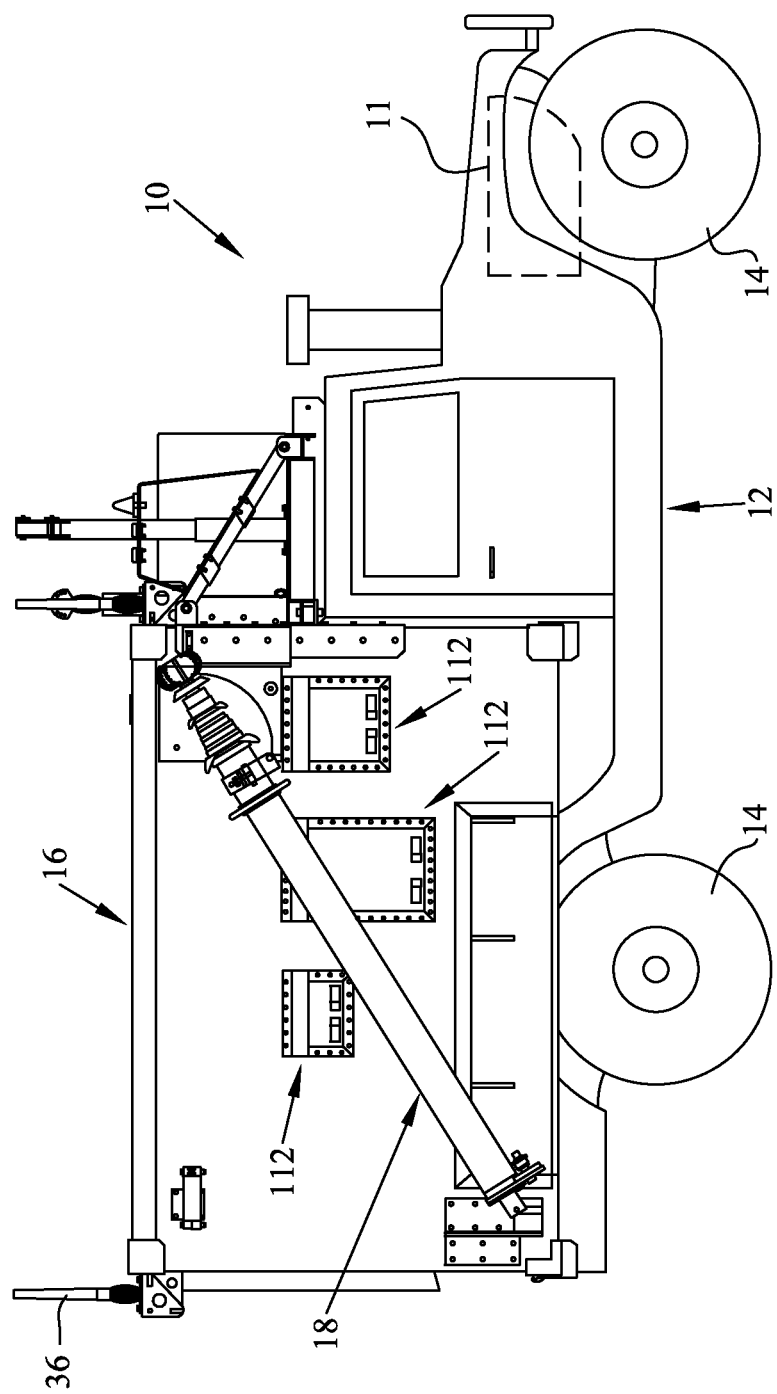
FIG. 1 is a side view of the vehicle of the present disclosure in a mobile configuration.

With reference first to FIG. 1, a vehicle 10 is disclosed which as disclosed is depicted as a truck, and more particularly as a military vehicle. It should be understood that the disclosure is equally applicable to commercial vehicles for use, for example, in radio or TV broadcasting or in any other application in which mobile and extensible communications devices are utilized.

As shown, vehicle 10 comprises a frame 12, and ground engaging members 14 which support the frame 12. Engine 11 provides power to at least one ground engaging member 14. As depicted, ground engaging members 14 are shown as tires and wheels, however it should be understood that other ground engaging members such as tracks or skis could be employed. The invention is equally applicable to any water flotation devices. As shown, a shelter assembly 16 is supported by the vehicle frame 12 and includes a mast assembly 18. Shelter assembly 16 is positioned on frame 12 in a fixed manner such that parts of vehicle 10 such as ground engaging members 14, engine 11, and frame 12, etc. have a fixed spatial relationship with shelter assembly 16.

Figure 2:
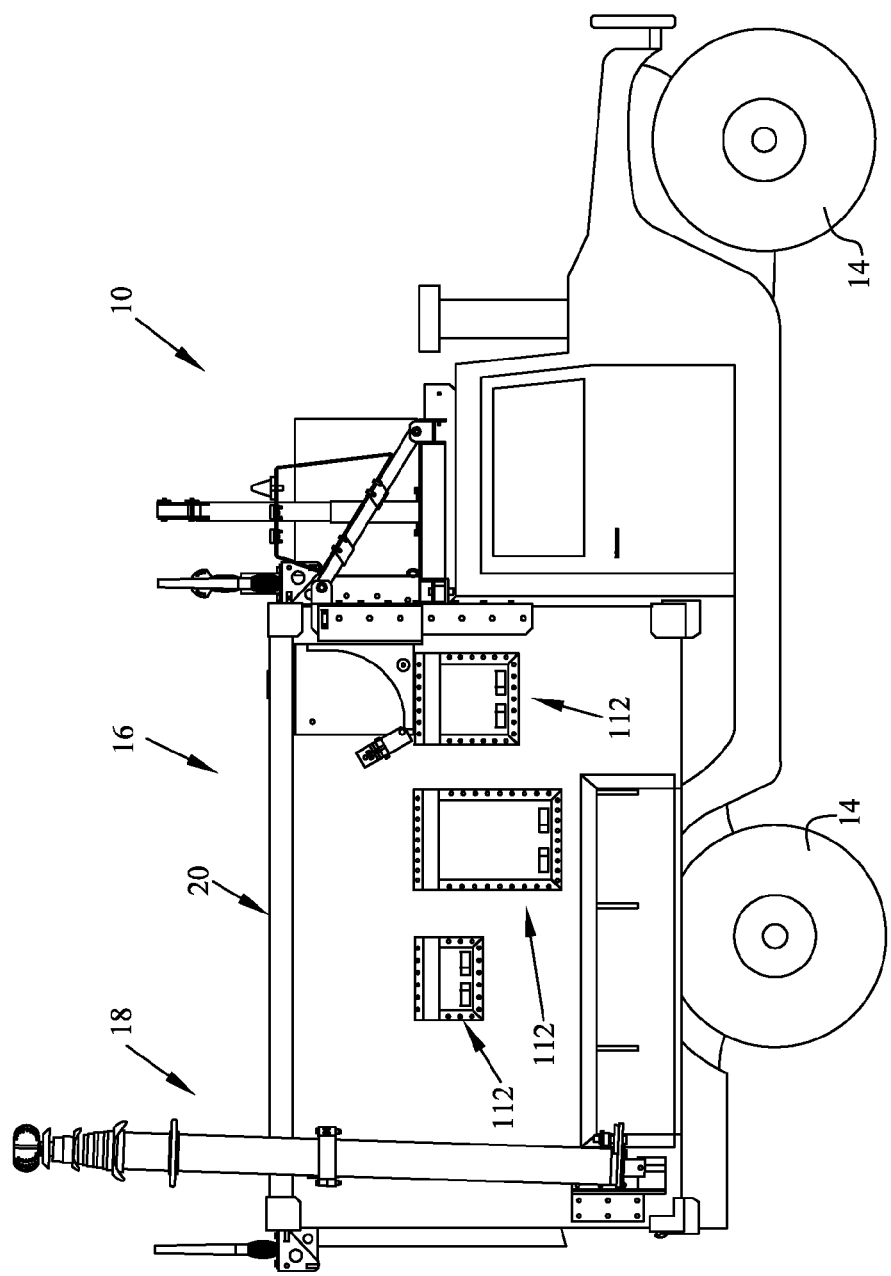
FIG. 2 is a side view of the vehicle of FIG. 1 in a stationary configuration.

FIG. 1 shows vehicle 10 having mast assembly 18 and antennae 36 in stowed positions suitable for transport. FIG. 2 shows mast assembly 18 in a vertical position that is ready for extension. Additional details of the mast assembly 18 are provided in U.S. Provisional Patent Application Ser. No. 61/291,694, filed Dec. 31, 2009, entitled "VEHICLE AND MAST MOUNTING ASSEMBLY THEREFOR," the disclosure of which has been expressly incorporated by reference herein.

With respect now to FIG. 2, shelter assembly 16 is shown in greater detail. Shelter assembly 16 includes an enclosure 20 having a top wall 22, a front wall 24, lower wall 25, side walls 26, 28 and rear wall 30. Shelter assembly 16 could also include a front work platform 32 including a hoist 34, as well as a plurality of antennas positioned around enclosure 20 and shown generally at 36. Walls 24, 26, 28, 30 include or potentially include signal interface assemblies 112 disposed therein. Shelter assembly 16 further includes cabling raceways 510, 512, 514 disposed therein, shown in FIG. 4B.

Figure 4A:
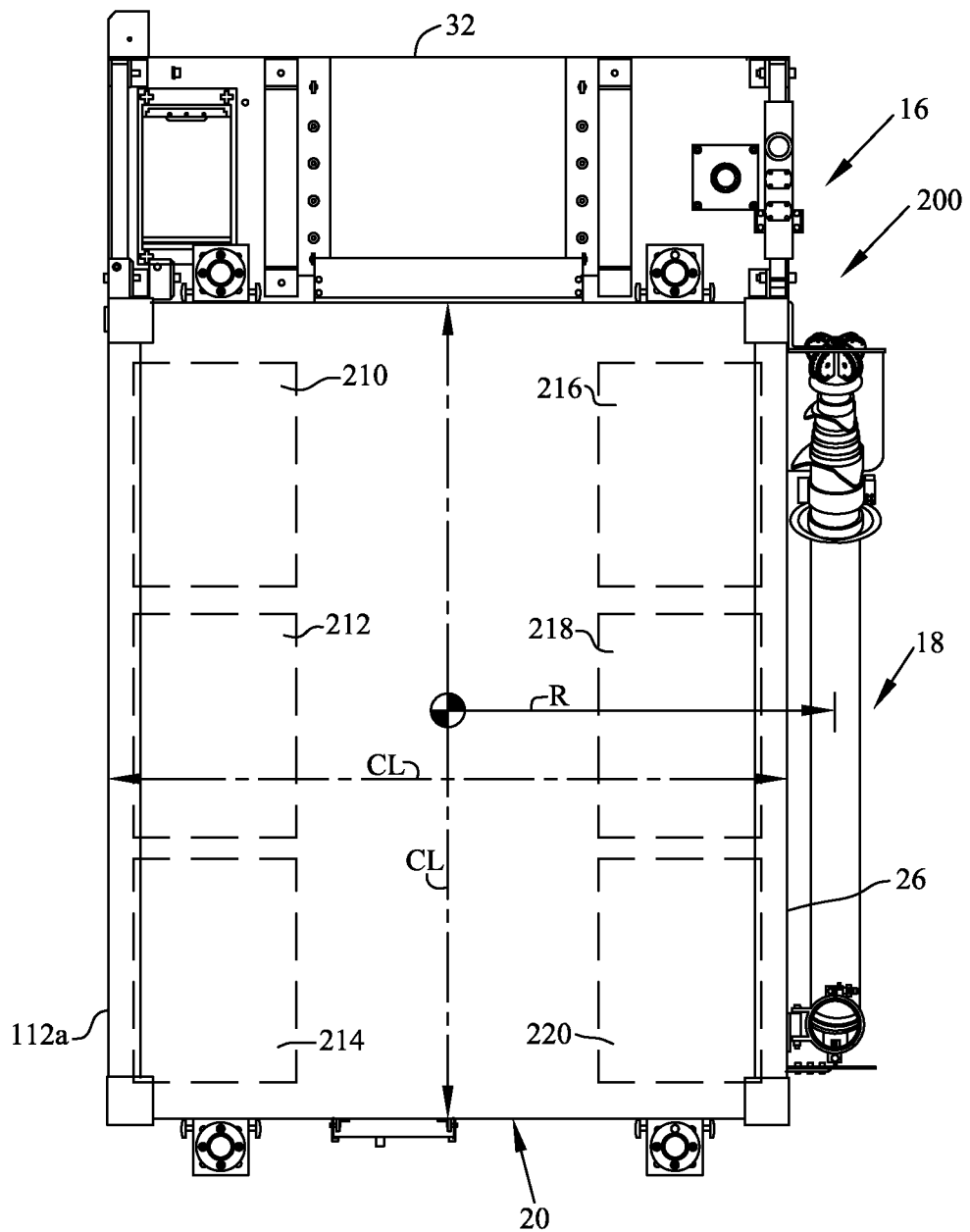
FIG. 4A is a top view of the shelter of FIG. 3.
Figure 4B:
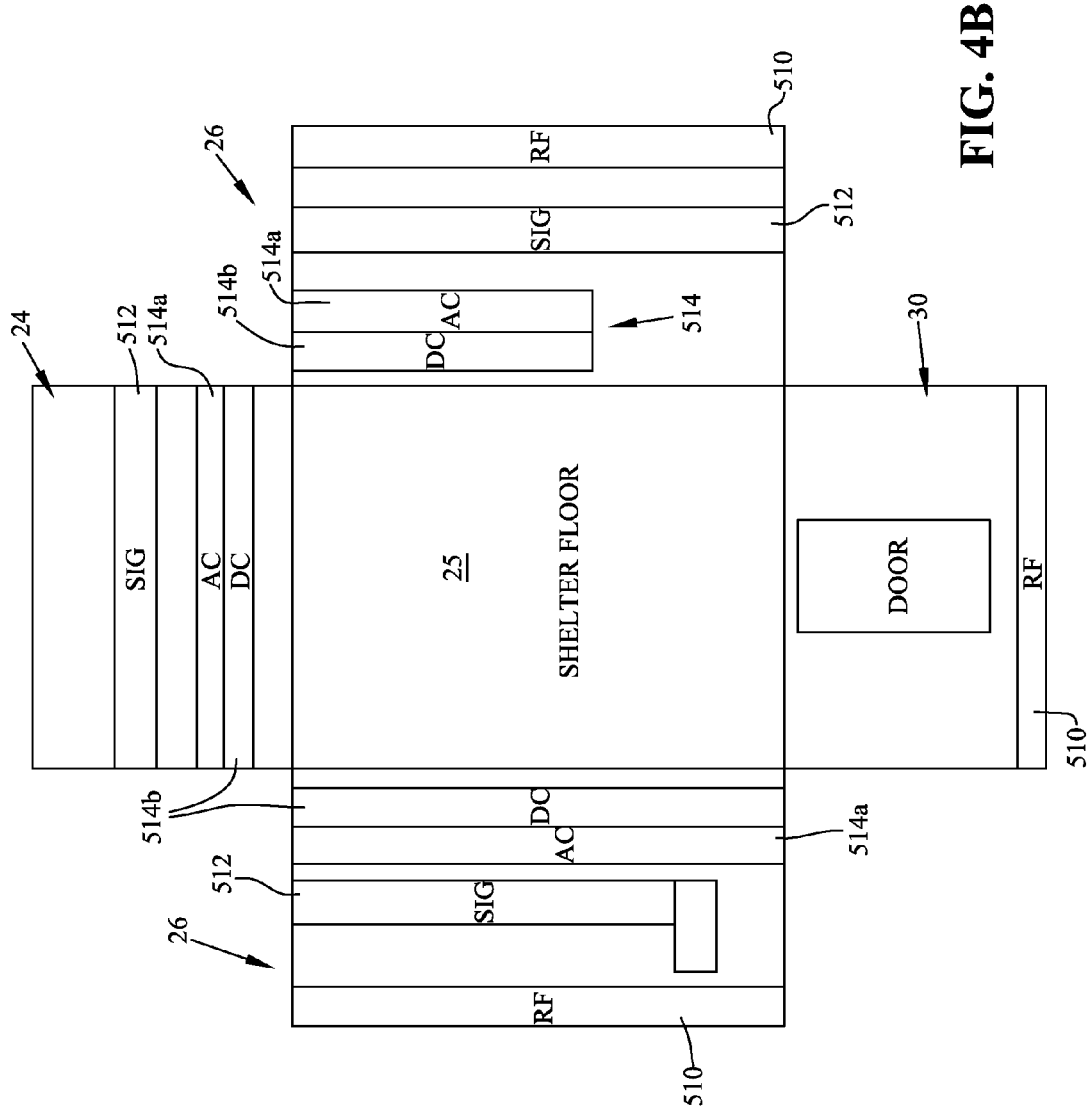
FIG. 4B is a top view showing flattened out walls of the shelter of FIG. 3.
Figure 4C:
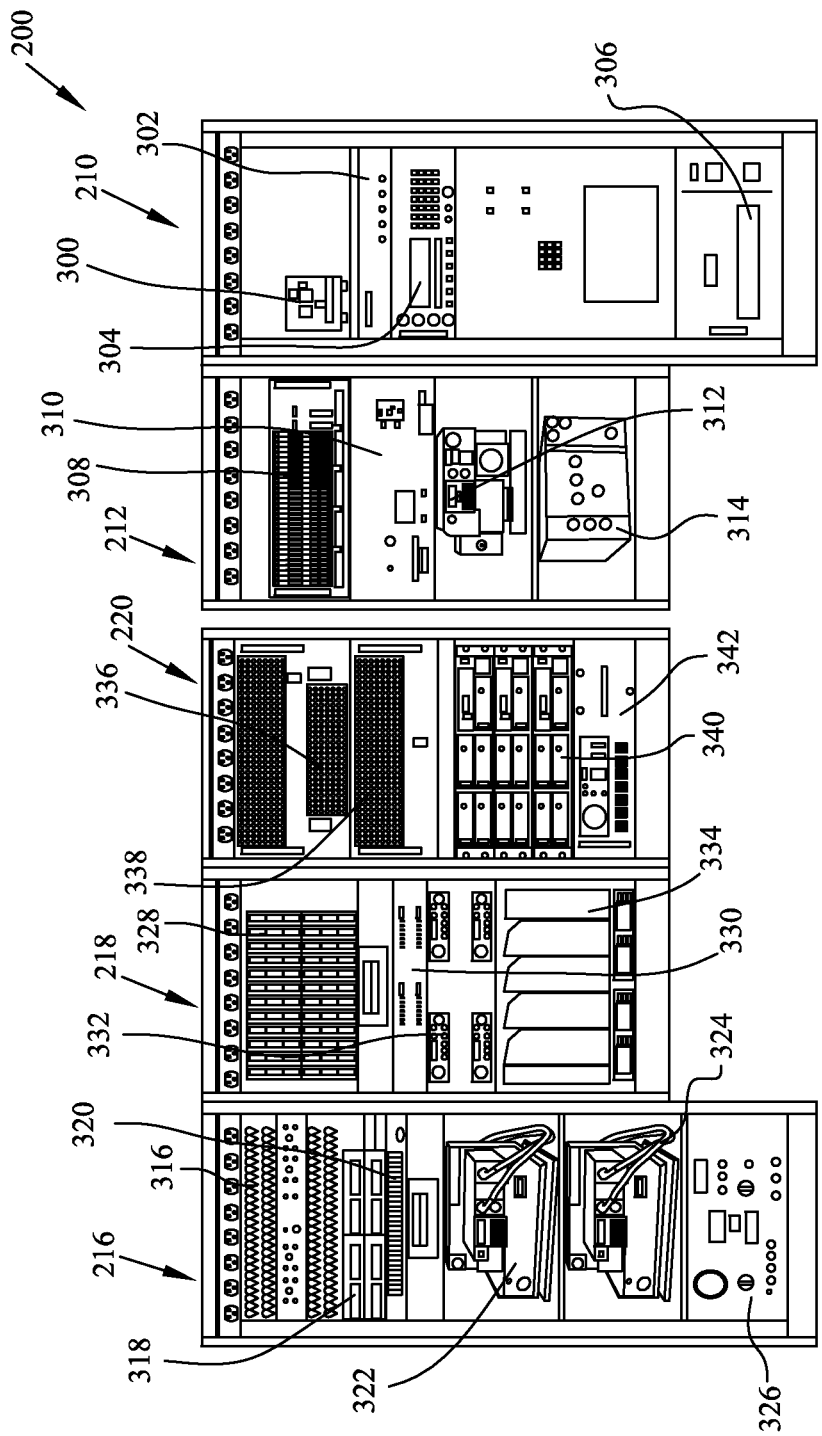
FIG. 4C is a side view of racks and electronics located within the shelter of FIG. 3.

Shelter assembly 16 houses a plurality of electronic racks 210, 212, 216, 218, 220 and safe 214 therein, shown in FIG. 4. Electronic equipment 200 is located on electronic racks 210, 212, 216, 218, 220 according multiple considerations. These considerations include, but are not limited to, weight of the equipment 200, center of gravity of shelter assembly 16, interconnections needed between equipment 200, cabling sizes of the interconnections, and cabling weight of the interconnections.

Equipment 200 is generally communications equipment including but not limited to: Ethernet switches, power distributors, speakers, headset interfaces, keyboards, filters, power supplies (uninterruptible or otherwise), PCI bus bays, servers, modems, encryption devices, secure terminal equipment devices, multi-band radios/transceivers (high frequency, very high frequency, and ultra high frequency), amplifiers for the radios, power supplies for the radios, mercury interface unit, GPS distribution system, low volume terminals, voice cable kit, and Ethernet kit.

As previously noted, equipment 200 requires interconnections. Equipment 200 further requires power. Raceways 510, 512, 514 are provided within for data, RF, and power cable routing and management. Raceways 510, 512, 514 include upper raceways 510, middle raceways 512, and lower raceways 514. Each raceway 510, 512, 514 generally extends along walls 24, 26, 30 parallel to top wall 22 at different heights. Raceways 510 contain and route radio frequency (RF) cabling exclusively. Raceways 510 are located proximate the top of shelter assembly 16 because RF cables connect radios to antennae 36 and antennae 36 are located at the external top wall 22 of shelter assembly 16. Raceways 512 contain and route data connections exclusively. Raceways 512 are positioned midway up walls 24, 26. Such positioning places raceways 512 and the cabling therein proximate the positioning of signal interface assemblies 112 that provide external connections for the data cabling. Raceways 514 contain and route power cables exclusively. Raceways 514 are internally divided to provide sub-raceways 514a, 514b. Raceways 514a contain and route alternating current (AC) power cables exclusively. Raceways 514b contain and route direct current (DC) power cables exclusively. Raceways 514 are located proximate lower wall 25 on walls 24, 26. However, raceways 514 do not abut shelter floor 27. Separation from shelter floor 27 permits raceways 514 to remain straight while clearing any wall 26 irregularities necessitated by a wheel well of vehicle 10. Furthermore, separation from shelter floor 27 decreases the likelihood of electrical complications should water collect on shelter floor 27.

By separating the cabling into exclusive raceways 510, 512, 514, the potential for cross-talk and data corruption is thereby lessened. Furthermore, the reduced likelihood of data corruption allows the use of interconnection wires having less shielding relative to those that would be needed in a mixed cabling environment. Cables having less shielding are lighter than the more heavily shielded cabling. Lower weight cabling, and lower weight in general, affect the weight distribution within shelter assembly 16 and the handling of vehicle 10. In general, lower weight components and lower overall weight lessen the size and cost of support components needed to support shelter assembly 16 on vehicle 10 both while stationary and while in motion. Additionally, cables with less shielding have a generally smaller cross-sectional area than equivalent cables with more shielding. Accordingly, an increased number of wires can be fit in a given space, such as raceways 510, 512, 514.

Raceways 510, 512, 514 allow the routing of data, RF, and power cables to relevant signal interface assemblies 112 and/or power interface assemblies 112 and/or antennae 36. Signal interface assembly 112 is illustratively configured to provide for simple and efficient electrical communication between an exterior 40 of shelter assembly 16 and an interior 42 of shelter assembly 16. More particularly, the signal interface assembly 112 permits communication (e.g., communication signals, electrical power, etc.) between equipment external to shelter assembly 16 and to equipment secured within shelter assembly 16. As indicated above, signal interface assembly 112 may be positioned within a vertical support structure, such as vertical wall 24, 26, 28, 30 of shelter assembly 16.

Signal interface assemblies 112 illustratively include support 44 having frame 46 coupled to housing 48. Frame 46 is illustratively formed of a durable material, such as aluminum, and includes an outer frame 50 and an inner frame 52 spaced apart from each other and defining a chamber 54 therebetween.

Outer frame 50 includes upper frame member 56 coupled to lower frame member 58. Both upper frame member 56 and lower frame member 58 are angled relative to each other. Water deflector 59 is coupled to lower frame member 58 and is configured to prevent water from collecting at the bottom of signal interface assembly 112. More particularly, deflector 59 is angled downwardly for directing water downwardly and outwardly from signal interface assembly 112.

Upper frame member 56 includes first and second openings 62 and 64 defined by rectangular mounting flanges 66 and 68, respectively. Outer surfaces of mounting flanges 66 and 68 define respective gasket seats 70 and 72. A plurality of mounting apertures 74 and 76 extend through each mounting flange 66 and 68, respectively.

Lower frame member 58 includes first and second openings 82 and 84 defined by rectangular mounting flanges 86 and 88, respectively. Outer surfaces of mounting flanges 86 and 88 define respective gasket seats 90 and 92. A plurality of mounting apertures 94 and 96 extend through each mounting flange 86 and 88, respectively.

A plurality of outer or external electrical interface panels 100, 102, 104 are removably coupled the outer frame 50 by a plurality of fasteners, illustratively bolts 106 received within mounting apertures 74, 76, 94, 96 of respective frame members 56, 58. Electromagnetic interference (EMI) gasket 108 is received intermediate each interface panel 100, 102, 104 and its respective gasket seat 70, 72, 90, 92. EMI gasket 108 is illustratively formed of an electrically conductive material, such as wire mesh material. In one illustrative embodiment, EMI gasket 108 comprises a carbon-filled cellular PTFE matrix. Pressure sensitive adhesive (PSA) may be supported by a rear surface of matrix.

Each outer electrical interface panel 100, 102 and 104 may be customized with a variety of different electrical connectors or ports. As further detailed herein, panels 100, 102, and 104 are modular and may be easily removed and replaced with other panels 100, 102, and 104 as desired.

In the illustrative embodiment, electrical interface panel 100 includes connectors 114, 116, and 118. Electrical interface panel 102 illustratively includes electrical connectors 120. Protective caps 122 may be releasably coupled to connectors 120 and are retained to panel 102 by cords 124. Electrical interface panel 104 illustratively includes electrical connectors 126 which may include threadably coupled protective caps 128. It should be appreciated that external panels 100, 102, 104 can be used as internal panels, described below, as desired.

Inner frame 52 illustratively includes upper frame member 132 and lower frame member 134 disposed within common plane 136. Upper frame member 132 includes first and second openings 138 (only one shown) defined by rectangular mounting flanges 142. Outer surfaces of mounting flanges 142 define gasket seats 146. A plurality of mounting apertures 150 extend through each mounting flange 142. Lower frame member 134 includes first and second openings 158 (only one shown) defined by rectangular mounting flanges 162. Outer surfaces of mounting flanges 162 define gasket seats 166. A plurality of mounting apertures 170 extend through each mounting flange 162.

A plurality of inner or internal electrical interface panels 100, 180, 182 are removably coupled the inner frame 52 by a plurality of fasteners, illustratively bolts 106 received within mounting apertures 150, 170 of respective frame members 132 and 134. Each inner electrical interface panel 100, 180, 182 may be customized with a variety of different electrical connectors or ports 114, 116, 118, 184. Panels 100, 180, 182 are modular and may be easily removed and replaced with other panels as desired.

In the illustrative embodiment, electrical interface panels 100, 180, 182 include connectors 114, 116, 118, 184, 185 suitable for receiving interconnect wires 186 able to transmit radio control signals, data signals, and radio transmissions as well as wires 188 able to transmit power.

Electrical wires or cables 186, 188 interconnect outer panels 100, 102, 104 to inner panels 100, 180, 182. More particularly, cables 186, 188 extend through chamber 54 of the support 44.

Housing 48 illustratively includes first and second vertical walls 220 interconnected by top and bottom walls 222, 224 to define a protective enclosure surrounding frame 46 and protecting it from debris and external elements.

Figure 5:
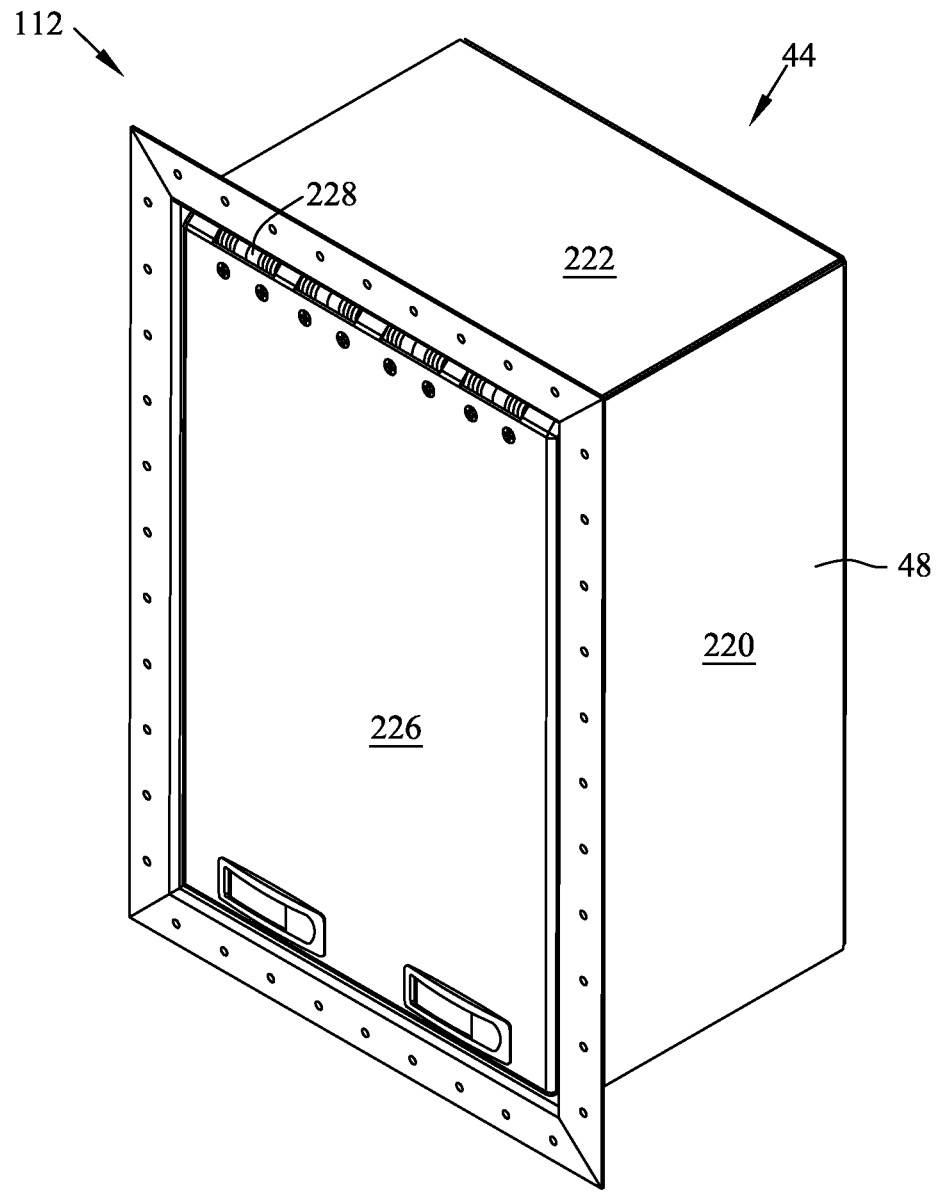
FIG. 5 is a perspective view of a connection housing of the shelter of FIG. 3.
Figure 6:
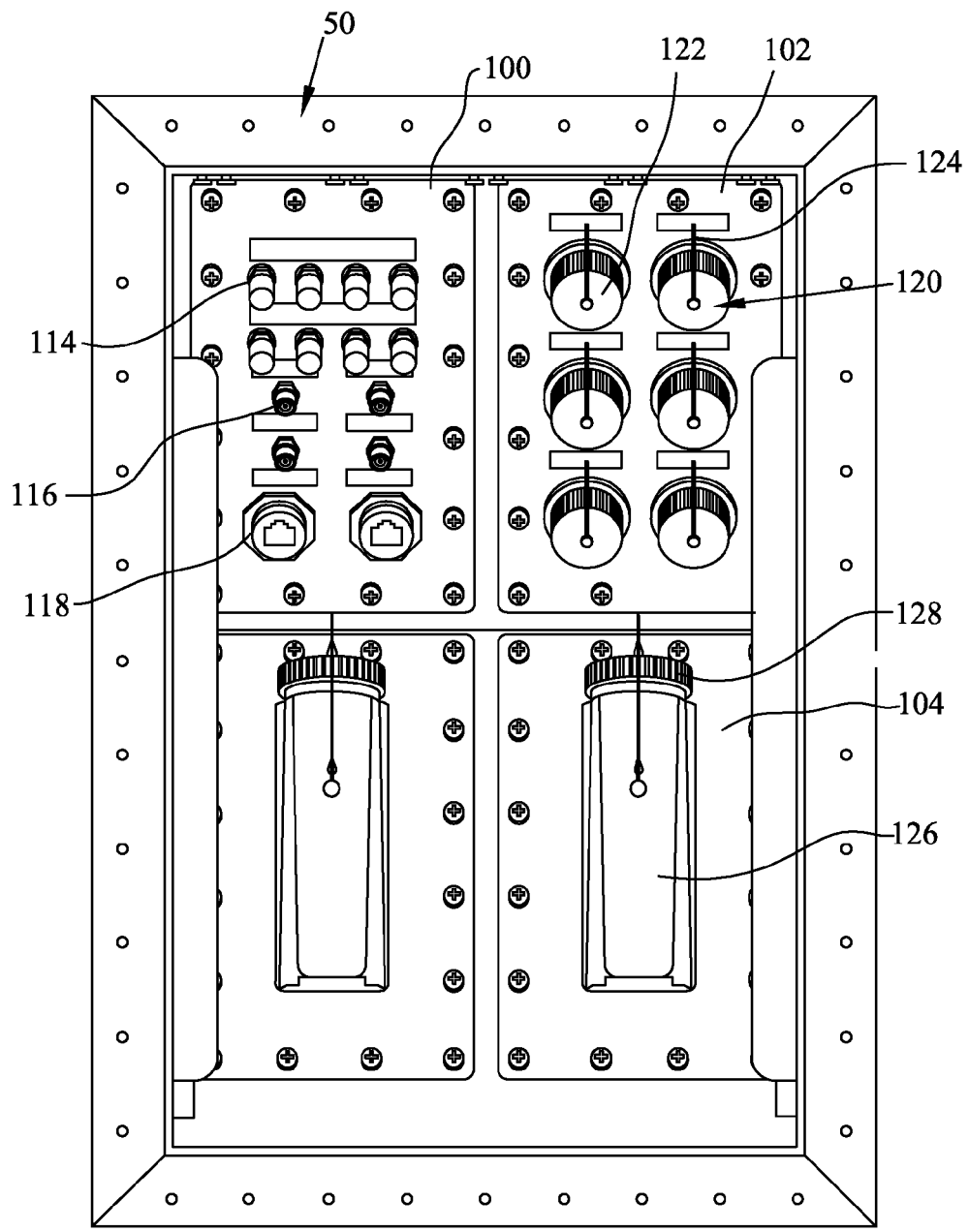
FIG. 6 is a plan view of a first set of connections present within the connection housing of FIG. 5.
Figure 7:
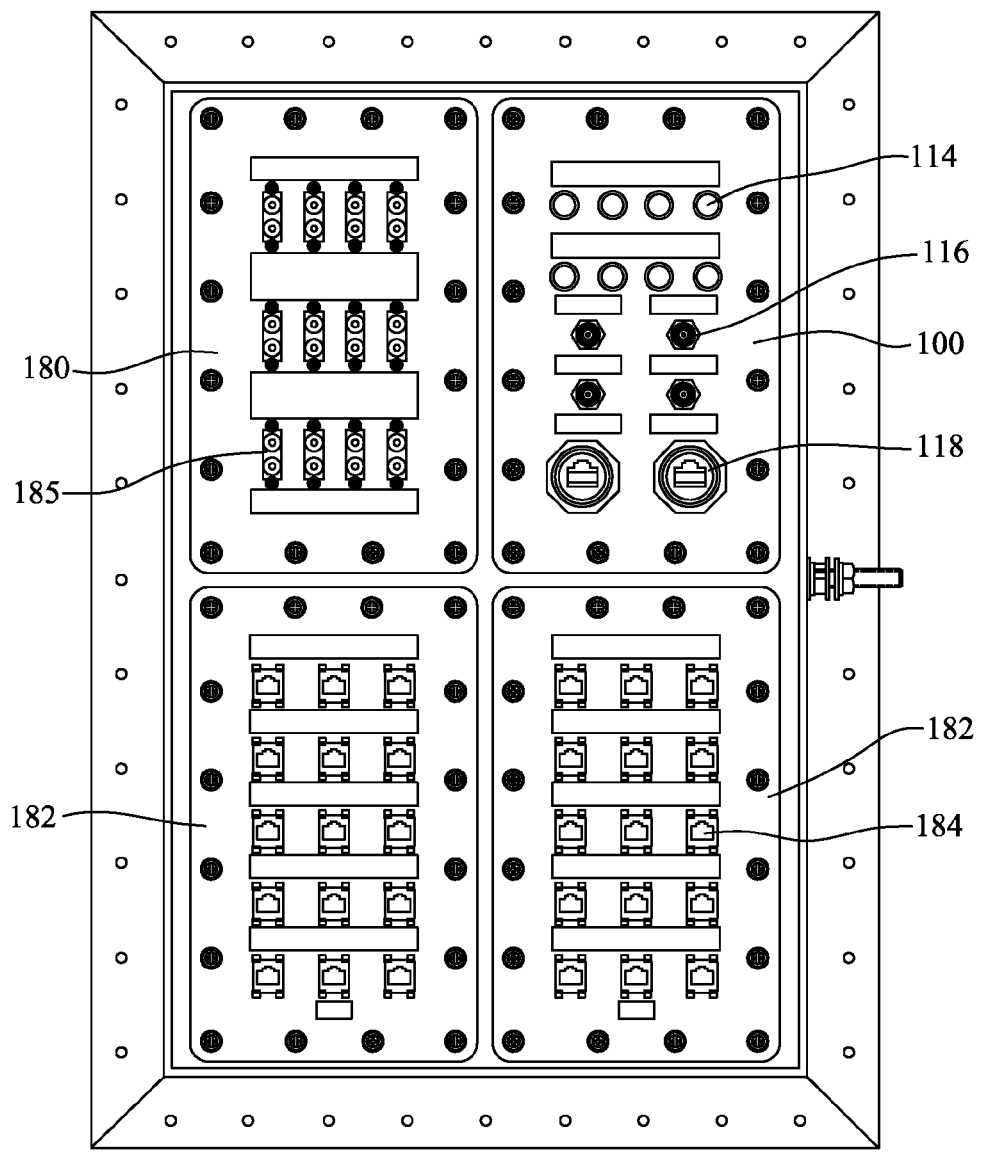
FIG. 7 is a plan view of a second set of connections present within the connection housing of FIG. 5.
Figure 8:
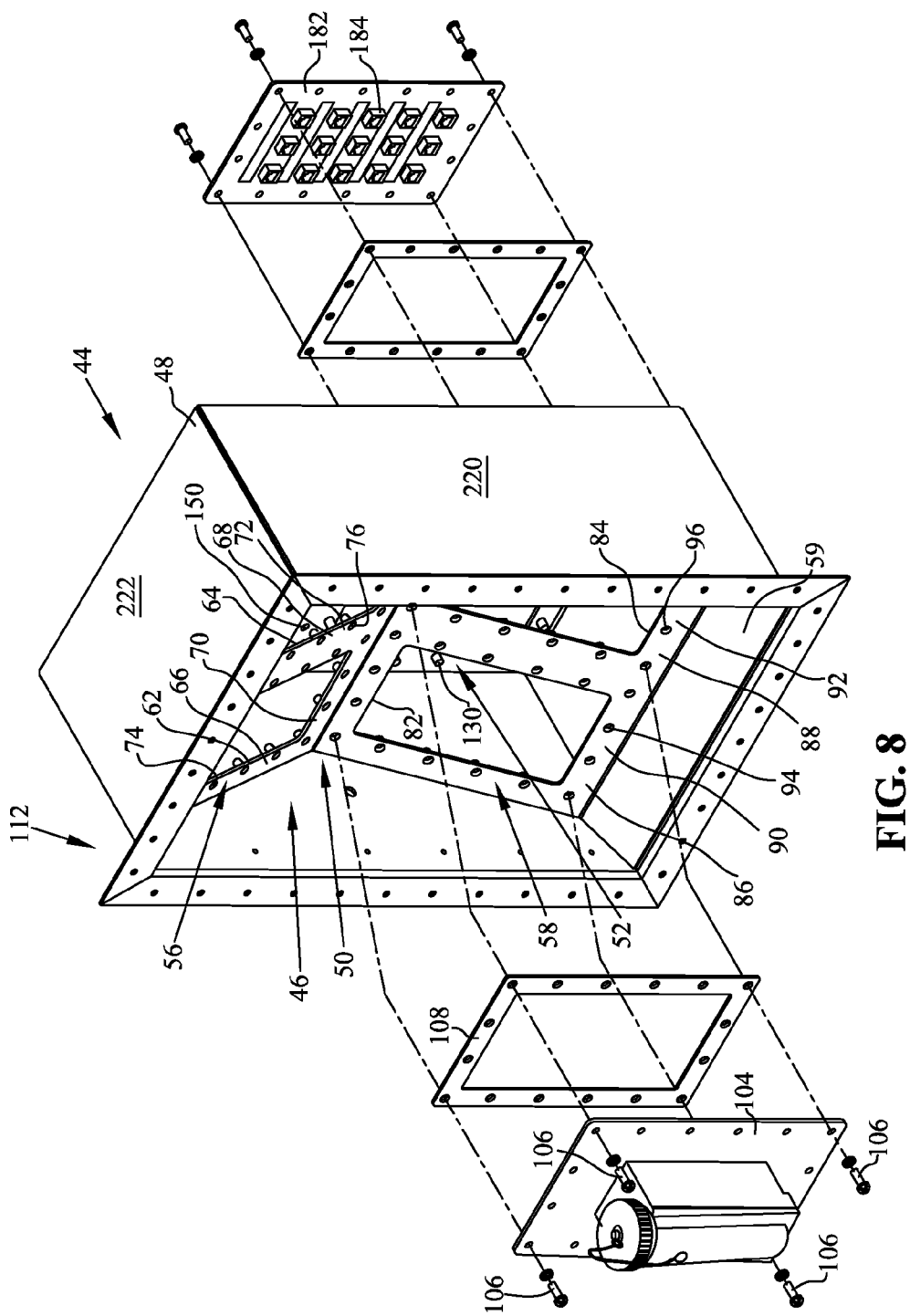
FIG. 8 is an exploded perspective view of the housing and connections of FIG. 6.
Figure 9:
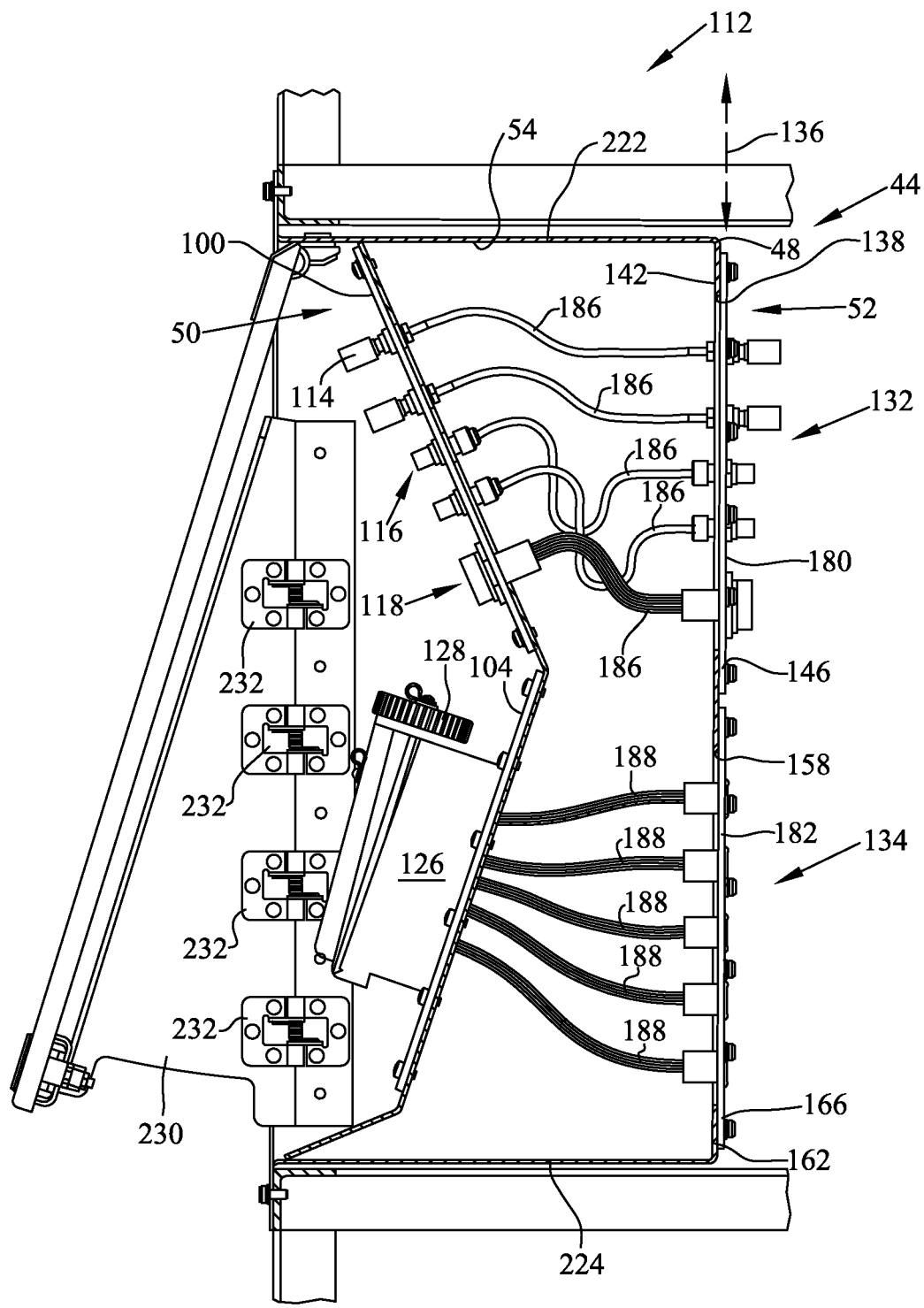
FIG. 9 is a side partially-cross sectional view of the housing and connections of FIGS. 6 and 8.

Movable cover 226 is coupled to housing 48 through a first or horizontal hinge 228. Cover 226 is movable between a stowed position substantially vertical, shown in FIG. 5, to a deployed position offset from vertical, shown in FIG. 9, to a fully opened position approximately 180 degrees from the closed position.

A pair of side shields or wings 230 are supported by a pair of second or vertical hinges 232. Side wings 230 are configured to move from a stowed position to a deployed position by rotating or pivoting about a substantially vertical axis.

Figure 3:
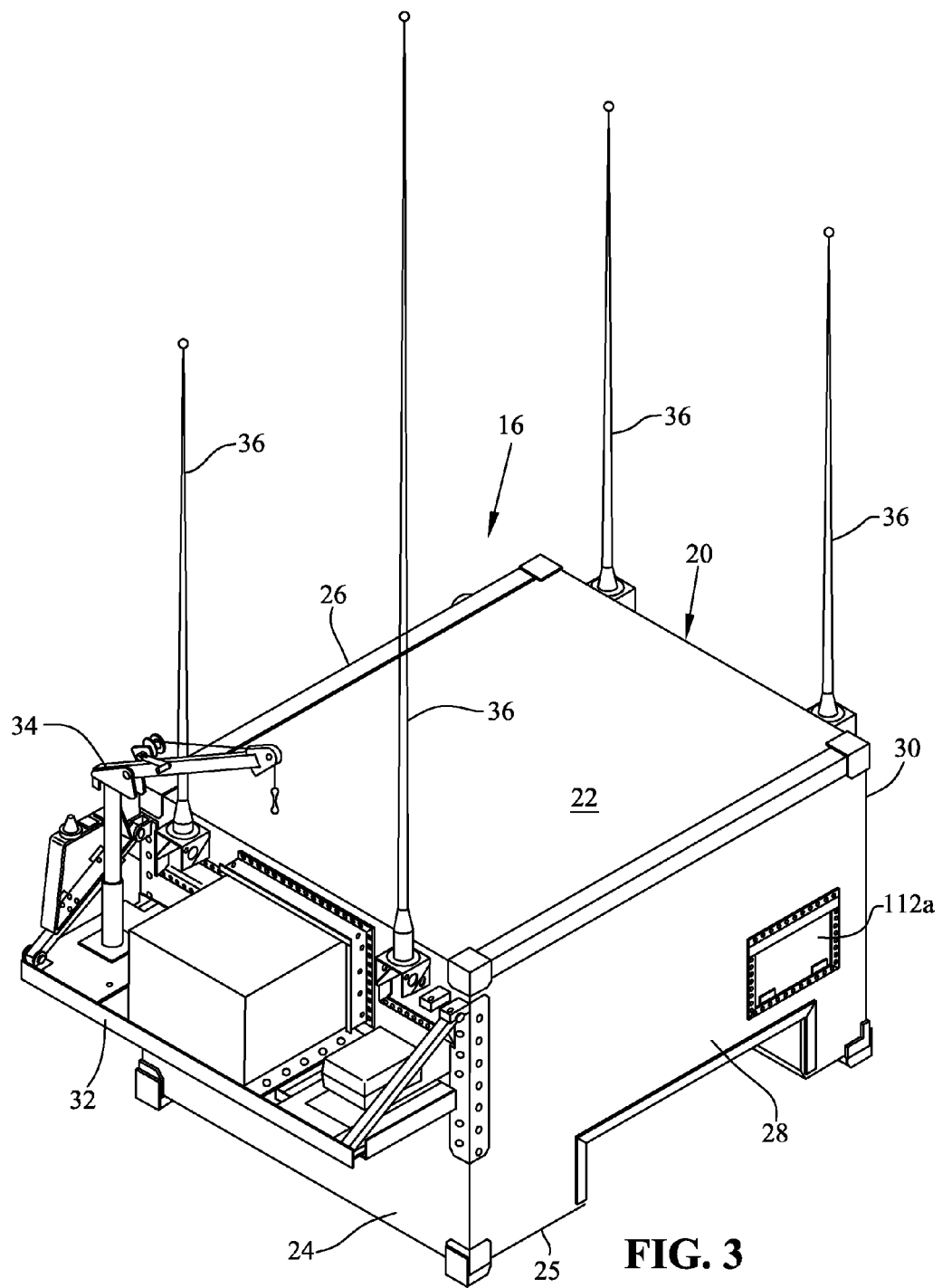
FIG. 3 is a front left perspective view of the shelter carried by the vehicle of FIG. 1.

By choosing the connectors and interface panels 100, 102, 104, external access points are created to link electronics 200 within shelter assembly 16 to electronics 200 within other similar shelter assemblies 16 or elsewhere. In one example, vehicle 10 pulls a mobile power generator 1000. Mobile power generator 1000 may have signal interface assemblies 112 of its own that, along with proper interconnect wiring, provide for interconnection with shelter assembly 16. Alternatively, power generator 1000 may have hardwired cabling that couples to interface panels 100, 102, 104. Shelter assembly 16 includes at least two interface panels 100, 102, 104 capable of transmitting power. In the provided example, power transmitting interface panels 100, 102, 104 are located in signal interface assembly 112a located in the left rear side wall 28 of shelter assembly 16, shown in FIG. 3. A first power interface panel 100, 102, 104 receives power from an external source such as mobile power generator 1000 or from another shelter assembly 16. A second power interface panel 100, 102, 104 is present to provide power to other shelter assemblies 16. Thus, a plurality of shelter assemblies 16 can be daisy-chained together to receive power from a single mobile power generator 1000 or otherwise.

As previously discussed, electronic equipment 200 is located on electronic racks 210, 212, 216, 218, 220 according multiple considerations. By way of example shown in FIG. 4C, rack 210 includes, cryptographic security device 300, pre/post selector 302, High Frequency (HF) communications device 304, and Data Terminal Set for radio communications 306. Rack 212 includes tactical data system to fiber converter 308, digital voice conferencing switch 310, tactical HF and VHF radio 312, and Multifunctional Information Distribution System 314. Rack 216 includes Ethernet patch panels 316, Multiservice Access Router 318, Ethernet Switch 320, multiband manpack radios 322, 324, and multichannel transceiver 326. Rack 218 includes serial patch panels 328, modems 330, encryption device 332, and data secure terminal equipment 334. Rack 220 includes coded communications device 336, PCI expansion chassis 338, Common Aviation Command and Control System 340, and universal power supply 342.

Figure 10:
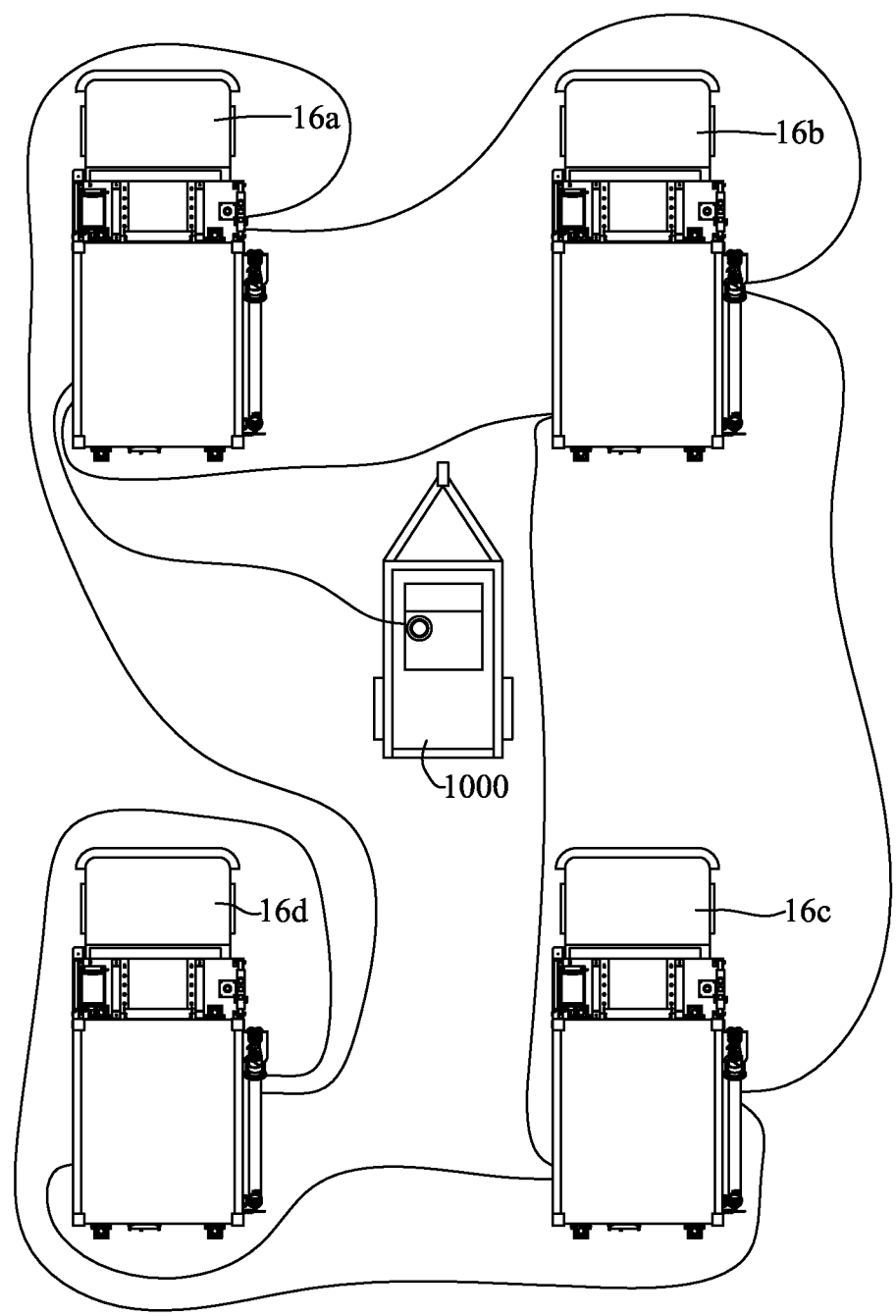
FIG. 10 is an overhead view of four of the vehicles of FIG. 1 that are coupled together and to a power generator.

Notably, High Frequency (HF) communications device 304 is able to provide/control/connect four channels of HF communication. However, electronics 200 overall are able to control more, for example 16, channels of HF communication. Accordingly, the limitations of High Frequency (HF) communications device 304 restrict the number of channels of HF communication controlled by a lone shelter assembly 16. To overcome this limitation, external connectors 114-116, present in signal interface assemblies 112, are provided. External connectors 114-116 of one shelter assembly 16 are coupled, via CAT5 cable or otherwise, to one or more other shelter assemblies 16. This connection allows the electronics 200 of one shelter assembly 16a, FIG. 10, to control and link the electronics 200 of the other shelter assemblies 16b-d, including the High Frequency (HF) communications devices 304 thereof. Accordingly, while each shelter assembly 16a-d contains a High Frequency (HF) communications device 304 that can control and link four channels of communication, by linking the shelter assemblies 16, a single shelter assembly 16 can control and link up to sixteen channels of communication. Thus, operators in one shelter assembly 16 can control the electronics 200 in multiple shelter assemblies 16. Similarly, a single power generator 1000 can couple to shelter assembly 16a to provide power thereto. Shelter assemblies 16b-c are then connected in a daisy-chain fashion to shelter assembly 16a and power generator 1000 to provide power to all shelter assemblies 16a-d as shown in FIG. 10.

Accordingly, vehicle 10 provides a platform for transporting a shelter assembly 16. When shelter assembly 16 is brought into the company of other similar shelter assemblies 16, shelter assemblies 16 can be linked for data and power via connections in signal interface assemblies 112. Furthermore, adjacent connected shelter assemblies 16 can be quickly detached. When detached, the respective shelter assemblies 16 can be quickly moved via respective vehicles 10.

While this invention has been described as having an exemplary design, the present invention may be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains.

What is claimed is:

1. A communications assembly including:
    a shelter housing comprising a plurality of walls comprising a first, second, third and fourth wall, wherein one of said walls comprises a moveable door adapted to enable an operator to enter or exit said shelter housing;
    a first, second, and third cabling, wherein said first cabling is adapted for carrying a radio frequency transmitting signal to an antenna, said second cabling is adapted for carrying non-radio frequency data transmitting signals, said third cabling is adapted for alternating current and direct current transmitting signals;
    a first cabling raceway disposed within the shelter housing, the first cabling raceway being adapted to contain and route said first cabling;
    a second cabling raceway disposed within the shelter housing, the second cabling raceway being adapted to contain and route said second cabling adapted for non-radio frequency data transmitting; and
    a third cabling raceway disposed within the shelter housing, the third cabling raceway being exclusively dedicated for said third cabling adapted for alternating current and direct current transmitting;
    a signal interface panel assembly adapted to extend through and couple with one of said walls of said shelter housing, said signal interface panel assembly comprising an outer and inner frame members, a first and second plurality of signal interface panels each adapted to receive and mount one or more electrical signal ports, a plurality of electromagnetic interference gaskets, and a plurality of fasteners adapted to couple said first and second plurality of signal interface panels with said inner and outer frame members;
    wherein said inner and outer frame members are formed with a plurality of openings each defined by mounting flanges defining gasket seats sections, said gasket seat sections are adapted couple with each of said electromagnetic interference gaskets, at least one of said plurality of electromagnetic interference gaskets are disposed between each said signal interface panels and a respective one of said gasket seat sections;
    wherein said inner frame member is positioned on an opposing side of said signal interface panel assembly from said outer frame member, said outer frame member is formed with a first frame section and a second frame section, wherein said first frame section is formed at an angle relative to said second frame section, each of said first and second frame sections are each adapted to receive at least one said signal interface panel and said electromagnetic interference gaskets;
    wherein said first, second and third cabling raceways are disposed along at least three of said plurality of walls.

2. The communications assembly of claim 1, wherein the first cabling being coupled to at least one radio antenna.

3. The communications assembly of claim 1, wherein the second cabling being coupled to at least one non-radio frequency data transmission source.

4. The communications assembly of claim 3, wherein the second cabling is further coupled to said signal interface assembly, the signal interface assembly providing said port accessible to the outside of the shelter housing, the port shaped and sized to receive a cable therein to electrically couple the cable to the at least one non-radio frequency data transmission source.

5. The communications assembly of claim 1, the third cabling being coupled to an electronic device, the electronic device receiving power from the third cabling.

6. The communications assembly of claim 5, wherein the third cabling is further coupled to said signal interface assembly, the signal interface assembly providing said port accessible to the outside of the shelter housing, the port shaped and sized to receive a cable therein to electrically couple the cable to the electronic device.

7. The communications assembly of claim 6, wherein the cable provides power to the electronic device.

8. The communications assembly of claim 6, wherein the cable transmits power from the electronic device.

9. The communications assembly of claim 6, wherein the cable is further coupled to a power generator.

10. The communications assembly of claim 1, wherein the first raceway extends generally parallel to a top of the shelter assembly and at a first distance from the top of the shelter assembly.

11. The communications assembly of claim 10, wherein the second raceway extends generally parallel to the top of the shelter assembly and at a second distance from the top of the shelter assembly, the second distance being greater than the first distance.

12. The communications assembly of claim 11, wherein the third raceway extends generally parallel to the top of the shelter assembly and at a third distance from the top of the shelter assembly, the third distance being greater than the second distance.

13. A communications vehicle, including:
a vehicle frame;
a first shelter housing supported by the frame, the first shelter housing defining an interior and an exterior;
a first communication device located within the interior of the first shelter housing; and
a first signal interface positioned on the first shelter housing, the first signal interface including an inner frame member and outer frame member positioned on opposing sides of said first signal interface, said signal interface further comprising a first and second plurality of ports disposed respectively in a plurality of first and second removable panels coupled respectively to said inner and outer frame members, each one of said first plurality of ports is coupled to a corresponding one of said second plurality of ports by at least one or more conductive member between said inner and outer frame members, at least one pair of said first and second said ports are adapted to be in communication with the first communication device; wherein the first communication device includes software therein that permits the first communication device to control and operate a second communication device that is substantially similar to the first communication device, that is located in a second shelter housing separate from the first shelter housing containing the first communication device, and that is electrically coupled via a wire to the signal interface.

14. The vehicle of claim 13, wherein the first and second communication devices are radios.

15. The vehicle of claim 14, wherein each radio independently provides four channels of radio frequency communication.

16. The vehicle of claim 15, wherein the first radio, when coupled to the second radio, controls all provided channels of radio frequency communication.

17. A vehicle array including:
a first vehicle including a first signal interface comprising a first power input interface and a first power output interface;
a second vehicle including a second signal interface comprising a second power input interface and a second power output interface;
a power generator having a third power output interface;
a first power cable linking the third power output interface of the power generator to the first power input interface of the first vehicle; and
a second power cable linking the first power output interface of the first vehicle to the second power input interface of the second vehicle;
wherein the first and second signal interfaces each further comprise an inner frame member and outer frame member, each of said inner and outer frame members are positioned on opposing sides of said first and second signal interfaces, each of said inner and outer frame members further comprise a plurality of removable plates coupled to each of said inner and outer frames by a plurality of removable fasteners, at least one of said first power input interfaces and said first power output interfaces are coupled to one of said plurality of removable plates;
a plurality of conductive members, wherein at least one of said conductive members are coupled to each of said first power input interfaces and said first power output interfaces at a first section, each of said conductive members are further attached to an interface section one of said plurality of removable plates, wherein said interface sections are adapted to permit an electrical power signal to pass through said removable plates;
wherein said first and second vehicles further respectively comprise a first and second power section, wherein said first power section is adapted to receive power from said first power input coupled to said power generator by said first power cable and transfer power from said power generator to said second vehicle from said first power output through said second power cable.

18. The vehicle array of claim 17, wherein the power input interfaces and power output interfaces of the first and second vehicles are each disposed in exterior walls of respective housings that are disposed on frames of the respective first and second vehicles.

19. The vehicle array of claim 18, wherein the housings of each vehicle contain communications equipment in electrical communication with the respective power input interface.

20. The vehicle array of claim 19, further including a data cable linking a signal interface of the housing of the first vehicle to a signal interface of the second vehicle.

21. A vehicle array as in claim 17, further comprising:
a plurality of electromagnetic interference gaskets;
wherein said inner and outer frame members are formed with a plurality of openings each defined by mounting flanges defining gasket seats sections, said gasket seat sections are adapted couple with each of said electromagnetic interference gaskets, said plurality of removable panels are formed so edges of said removable panels do not extend beyond said gasket seat sections, at least one of said plurality of electromagnetic interference gaskets are disposed between each said plurality of removable panels and a respective one of said gasket seat sections.

22. A vehicle array as in claim 17, wherein said outer frame member is formed with a first frame section and a second frame section, each said first frame section and said frame section are formed with at least one said removable plate, wherein said first frame section is formed at an angle relative to said second frame section.

23. A vehicle including:
a frame,
an engine supported by the frame, the engine operatively coupled to ground engaging members and capable of imparting motion to at least one of the ground engaging members;
a shelter housing coupled to the frame and dependent upon the frame for supporting the shelter housing;
a first communication device located within the interior of the shelter housing; and
a signal interface adapted to extend through and couple with the shelter housing, the signal interface including an outer and inner frame members, a plurality of removable panels, a first and second plurality of signal interface panels each adapted to receive and mount one or more ports thereon in communication the first communication device, each said inner and outer frame is formed with a plurality of openings defined by an interface flange surrounding said openings, each of said removable panels are formed having edges that do not extend past said opening flanges, each of said removable panels are coupled to said inner or outer frame by a plurality of removable fasteners, said inner frame member and said outer frame member are positioned on opposing sides of said signal interface, wherein at least one said port is disposed in each of said removable panels;
wherein the first communication device includes software therein that permits the first communication device to control and operate a second communication device that is substantially similar to the first communication device, that is located in a shelter housing separate from the shelter housing containing the first communication device, and that is electrically coupled via a wire to the signal interface.

24. The vehicle of claim 23, wherein the position of the engine relative to the shelter housing is fixed.

25. The vehicle of claim 23, wherein all ground engaging members providing support to the shelter housing also provide support for the engine.

26. A power and communications system including:
a power generator having a first power output interface;
a first vehicle frame and a second vehicle frame;
a first and second engine respectively supported by the first vehicle and second vehicle frame, the engine operatively coupled to ground engaging members and capable of imparting motion to at least one of the ground engaging members;
a first shelter housing and a second shelter housing supported respectively by the first and second vehicle frames, each said shelter housing defining an interior and an exterior, wherein said first shelter housing further comprising a first interface assembly comprising a first power input interface and second power output interface, said second shelter housing further comprising a second interface assembly comprising a second power input interface and a third power output interface;
a first power cable linking the first power output interface of the power generator to the second power input interface of the first vehicle; and
a second power cable linking the second power output interface of the first vehicle to the second power input interface of the second vehicle;
a first cabling raceway disposed within each of the first and second shelter housings, the first cabling raceway being exclusively dedicated for radio frequency transmitting cabling;
a second cabling raceway disposed within each of the first and second shelter housings, the second cabling raceway being exclusively dedicated for non-radio frequency data transmitting cabling;
a third cabling raceway disposed within each of the first and second shelter housings, the third cabling raceway being exclusively dedicated for alternating current and direct current transmitting cabling;
a first communication device located within the interior of the first shelter housing;
a second communication device located within the interior of the second shelter housing; and
a first and second signal interface disposed respectively into the first and second interface assembly, the first and second signal interfaces including an outer and inner frame members, a plurality of removable panels, a first and second plurality of signal interface panels each adapted to receive and mount one or more ports therein respectively in communication the first communication device; wherein the first communication device includes machine readable software encoded on a machine readable storage medium therein that enables the first communication device to control and operate the second communication device and that is electrically coupled via a wire to the first signal interface;
wherein the first and second communication devices are radios or electromagnetic wave communication devices, each first and second communication devices independently provides a plurality of channels for communication.

27. A power and communications system as in claim 26, the first cabling being coupled to at least one radio antenna.

28. A power and communications system as in claim 26, the second cabling being coupled to at least one non-radio frequency data transmission source.

29. A power and communications system as in claim 26, wherein each of the first raceways extends generally parallel to a top of the first and second shelter housing and at a first distance from the top of each of the first and second shelter assemblies.

30. A power and communications system as in claim 29, wherein each of the second raceways extends generally parallel to the top of the shelter assembly and at a second distance from the top of each of the first and second shelter assemblies, the second distance being greater than the first distance.

31. A power and communications system as in claim 30, wherein each of the third raceways extends generally parallel to the top of each of the first and second shelter housing and at a third distance from the top of each of the shelter assemblies, the third distance being greater than the second distance.

32. A power and communications system as in claim 26, wherein the communication device, when coupled to the second communication device, controls all provided channels of communication.

33. A power and communications system as in claim 32, wherein the power input interfaces and power output interfaces of the first and second vehicle frames are each disposed in exterior walls of respective shelter housings that are disposed on the frames of the respective first and second vehicle frames.

34. A power and communications system as in claim 26, further comprising:
a plurality of electromagnetic interference gaskets;
wherein said inner and outer frame members are formed with a plurality of openings each defined by mounting flanges defining gasket seats sections, said gasket seat sections are adapted couple with each of said electromagnetic interference gaskets, said plurality of removable panels are formed so edges of said removable panels do not extend beyond said gasket seat sections, at least one of said plurality of electromagnetic interference gaskets are disposed between each said plurality of removable panels and a respective one of said gasket seat sections.

35. A power and communications system as in claim 26, wherein said outer frame member is formed with a first frame section and a second frame section, each said first frame section and said frame section are formed with at least one said removable plate, wherein said first frame section is formed at an angle relative to said second frame section.

* * * * *